United States Patent
Roukes et al.

(10) Patent No.: US 11,621,671 B2
(45) Date of Patent: *Apr. 4, 2023

(54) NANOMECHANICAL NETWORKS FOR COMPUTATION

(71) Applicant: California Institute of Technology, Pasadena, CA (US)

(72) Inventors: Michael L. Roukes, Pasadena, CA (US); Matthew H. Matheny, Pasadena, CA (US); Chung Wah Fon, Alhambra, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/543,424

(22) Filed: Dec. 6, 2021

(65) Prior Publication Data

US 2022/0094303 A1    Mar. 24, 2022

Related U.S. Application Data

(63) Continuation of application No. 16/863,852, filed on Apr. 30, 2020, now Pat. No. 11,218,115.

(Continued)

(51) Int. Cl.
  *H03B 5/36*    (2006.01)
  *B82Y 10/00*   (2011.01)
  (Continued)

(52) U.S. Cl.
  CPC .............. *H03B 5/366* (2013.01); *B82Y 10/00* (2013.01); *H01Q 23/00* (2013.01); *H04B 17/11* (2015.01); *H04B 17/21* (2015.01)

(58) Field of Classification Search
  CPC ...................................................... H03B 5/366
  (Continued)

(56) References Cited

U.S. PATENT DOCUMENTS 11,218,115 B2 *   1/2022  Roukes ................. B82Y 10/00
2010/0074445 A1   3/2010  Nefedov et al.
(Continued)

OTHER PUBLICATIONS

U.S. Appl. No. 16/863,852, "Advisory Action", dated Jul. 28, 2021, 2 pages.
(Continued)

*Primary Examiner* — Joseph Chang
(74) *Attorney, Agent, or Firm* — Kilpatrick Townsend & Stockton LLP (57) ABSTRACT

A nanoelectromechanical systems (NEMS) oscillator network and methods for its operation are disclosed. The NEMS oscillator network includes one or more network inputs configured to receive one or more input signals. The NEMS oscillator network also includes a plurality of NEMS oscillators coupled to the one or more network inputs. Each of the plurality of NEMS oscillators includes a NEMS resonator and produces a radio frequency (RF) output signal that oscillates at a particular frequency and a particular phase. The NEMS oscillator network further includes a plurality of connections that interconnect the plurality of NEMS oscillators. The NEMS oscillator network further includes one or more network outputs coupled to the plurality of NEMS oscillators and configured to output one or more output signals.

20 Claims, 7 Drawing Sheets

Related U.S. Application Data (60) Provisional application No. 62/841,112, filed on Apr. 30, 2019.

(51) Int. Cl.
*H04B 17/21* (2015.01)
*H04B 17/11* (2015.01)
*H01Q 23/00* (2006.01)

(58) Field of Classification Search
USPC .................................................... 331/116 R
See application file for complete search history.

(56) References Cited

U.S. PATENT DOCUMENTS

2011/0057734 A1 3/2011 White et al.
2013/0187720 A1 7/2013 Ishii
2014/0176203 A1 6/2014 Matheny et al.
2016/0181977 A1 6/2016 Gourlat et al.
2017/0170785 A1 6/2017 Tousi et al.

OTHER PUBLICATIONS

U.S. Appl. No. 16/863,852 , "Final Office Action", dated May 19, 2021, 13 pages.
U.S. Appl. No. 16/863,852 , "Non-Final Office Action", dated Mar. 12, 2021, 12 pages.
U.S. Appl. No. 16/863,852 , "Notice of Allowance", dated Aug. 30, 2021, 5 pages.
PCT/US2020/030832 , "International Preliminary Report on Patentability", dated Nov. 11, 2021, 7 pages.
PCT/US2020/030832 , "International Search Report and Written Opinion", dated Jul. 30, 2020, 8 pages.

* cited by examiner

NANOMECHANICAL NETWORKS FOR COMPUTATION

CROSS-REFERENCES TO RELATED APPLICATIONS

This application is a continuation of U.S. patent application Ser. No. 16/863,852, filed on Apr. 30, 2020, entitled "NANOMECHANICAL NETWORKS FOR COMPUTATION", which claims priority to U.S. Provisional Patent Application No. 62/841,112, filed on Apr. 30, 2019, entitled "NANOMECHANICAL NETWORKS FOR COMPUTATION", the disclosures of which are hereby incorporated by reference in their entirety.

STATEMENT AS TO RIGHTS TO INVENTIONS MADE UNDER FEDERALLY SPONSORED RESEARCH AND DEVELOPMENT

This invention was made with government support under Grant Nos. W911NF-13-1-0340 and W911NF-13-1-0390 awarded by the United States Army. The government has certain rights in the invention.

BACKGROUND OF THE INVENTION

From advanced machine learning to image processing in cellphone camera systems, central processing unit (CPU)-centric computation is declining. For example, for many smart phone devices, a significant portion of the processing is currently not carried out by the CPU but is instead performed by application-specific chips including graphics processing units (GPUs), image signal processors (ISPs), modems, etc. The same issue is manifested prominently in machine learning due to the extensive calculations required for combinatorial optimization and low-precision matrix multiplication.

For many of these applications, the communications delay between the processor and the memory, known as the von Neumann bottleneck, is particularly severe given the large amount of data that is to be processed and the significant amount of memory this utilizes. While complementary metal oxide semiconductor (CMOS) accelerators achieve faster performance through parallelization, nonuniformly-distributed loads across parallel cores and the synchronous nature of current architectures inevitably leads to slow-downs. Combined with the likely end of CMOS scaling, the development of new and alternative large scale, fast, and low power solutions is needed.

SUMMARY OF THE INVENTION

The present invention relates generally to methods and systems for performing computations using nanoelectromechanical systems (NEMS) oscillator networks. More particularly, embodiments of the present invention relate to the structures of such networks and methods for training them for particular tasks.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a nanoelectromechanical systems (NEMS) oscillator network including: one or more network inputs, where the one or more network inputs are configured to receive one or more input signals. The nanoelectromechanical systems also includes a plurality of NEMS oscillators coupled to the one or more network inputs, where each NEMS oscillator of the plurality of NEMS oscillators produces a radio frequency (RF) output signal that oscillates at a particular frequency and a particular phase. The nanoelectromechanical systems also includes a plurality of connections that interconnect the plurality of NEMS oscillators such that each NEMS oscillator of the plurality of NEMS oscillators is connected to at least one other NEMS oscillator of the plurality of NEMS oscillators through at least one connection of the plurality of connections. The nanoelectromechanical systems also includes one or more network outputs, the one or more network outputs being coupled to the plurality of NEMS oscillators, where the one or more network outputs are configured to output one or more output signals. Other embodiments of this aspect include corresponding computer systems, apparatus, and computer programs recorded on one or more computer storage devices, each configured to perform the actions of the methods.

Implementations may include one or more of the following features. The NEMS oscillator network where each NEMS oscillator of the plurality of NEMS oscillators includes a NEMS resonator. The NEMS oscillator network where each NEMS oscillator of the plurality of NEMS oscillators includes a feedback path between an output of the NEMS resonator and an input of the NEMS resonator. The NEMS oscillator network where each connection of the plurality of connections includes a coupling weight of a plurality of coupling weights, the coupling weight causing a change in amplitude to RF output signals passing through the connection. The NEMS oscillator network where each coupling weight of the plurality of coupling weights further causes a change in phase to the RF output signals passing through the connection. The NEMS oscillator network where the RF output signal produced at each NEMS oscillator of the plurality of NEMS oscillators is sent through at least one connection of the plurality of connections. The NEMS oscillator network where the NEMS oscillator network is trained by a training process that: provides the one or more input signals at the one or more network inputs. The NEMS oscillator network may also include reads the one or more output signals at the one or more network outputs. The NEMS oscillator network may also include performs a comparison between the one or more output signals and one or more reference output signals. The NEMS oscillator network may also include modifies the NEMS oscillator network based on the comparison. Implementations of the described techniques may include hardware, a method or process, or computer software on a computer-accessible medium.

One general aspect includes a method of operating a NEMS oscillator network, the method including: receiving one or more input signals at one or more network inputs of the NEMS oscillator network. The method also includes producing, for each NEMS oscillator of a plurality of NEMS oscillators of the NEMS oscillator network, a radio frequency (RF) output signal that oscillates at a particular frequency and a particular phase, where the plurality of NEMS oscillators are coupled to the one or more network inputs, and where the NEMS oscillator network includes a plurality of connections that interconnect the plurality of NEMS oscillators such that each NEMS oscillator of the plurality of NEMS oscillators is connected to at least one other NEMS oscillator of the plurality of NEMS oscillators through at least one connection of the plurality of connections. The method also includes outputting one or more output signals at one or more network outputs of the NEMS oscillator network, the one or more network outputs being coupled to the plurality of NEMS oscillators. Other embodiments of this aspect include corresponding computer systems, apparatus, and computer programs recorded on one or more computer storage devices, each configured to perform the actions of the methods.

Implementations may include one or more of the following features. The NEMS oscillator network where each NEMS oscillator of the plurality of NEMS oscillators includes a NEMS resonator. The method where each NEMS oscillator of the plurality of NEMS oscillators includes a feedback path between an output of the NEMS resonator and an input of the NEMS resonator. The method where each connection of the plurality of connections includes a coupling weight of a plurality of coupling weights, the coupling weight causing a change in amplitude to RF output signals passing through the connection. The method where each coupling weight of the plurality of coupling weights further causes a change in phase to the RF output signals passing through the connection. The method where the RF output signal produced at each NEMS oscillator of the plurality of NEMS oscillators is sent through at least one connection of the plurality of connections. Implementations of the described techniques may include hardware, a method or process, or computer software on a computer-accessible medium.

One general aspect includes a method of training a NEMS oscillator network, the method including: providing one or more input signals to one or more network inputs of the NEMS oscillator network. The method also includes producing, for each NEMS oscillator of a plurality of NEMS oscillators of the NEMS oscillator network, a radio frequency (RF) output signal that oscillates at a particular frequency and a particular phase, where the plurality of NEMS oscillators are coupled to the one or more network inputs, and where the NEMS oscillator network includes a plurality of connections that interconnect the plurality of NEMS oscillators such that each NEMS oscillator of the plurality of NEMS oscillators is connected to at least one other NEMS oscillator of the plurality of NEMS oscillators through at least one connection of the plurality of connections. The method also includes reading one or more output signals at one or more network outputs of the NEMS oscillator network, the one or more network outputs being coupled to the plurality of NEMS oscillators. The method also includes performing a comparison between the one or more output signals and one or more reference output signals. The method also includes modifying the NEMS oscillator network based on the comparison. Other embodiments of this aspect include corresponding computer systems, apparatus, and computer programs recorded on one or more computer storage devices, each configured to perform the actions of the methods.

Implementations may include one or more of the following features. The method where each NEMS oscillator of the plurality of NEMS oscillators includes a NEMS resonator. The method where each NEMS oscillator of the plurality of NEMS oscillators includes a feedback path between an output of the NEMS resonator and an input of the NEMS resonator. The method where each connection of the plurality of connections includes a coupling weight of a plurality of coupling weights, the coupling weight causing a change in amplitude to RF output signals passing through the connection. The method where modifying the NEMS oscillator network based on the comparison includes modifying the change in amplitude for at least one of the plurality of coupling weights. The method where each coupling weight of the plurality of coupling weights further causes a change in phase to the RF output signals passing through the connection. The method where the RF output signal produced at each NEMS oscillator of the plurality of NEMS oscillators is sent through at least one connection of the plurality of connections. Implementations of the described techniques may include hardware, a method or process, or computer software on a computer-accessible medium.

Numerous benefits are achieved by way of the present invention over conventional techniques. For example, the described NEMS oscillator networks can be upscaled to very large networks (for example, having hundreds of thousands of nodes) to enable extremely complex calculations. In one example, a 1,000 node network can outperform current GPUs by four orders of magnitude. As another example, a 100,000 node network can compete with, or outperform, large cloud-based systems/services that are currently employed for machine learning. Each NEMS element in the system can directly generate RF electrical signals that are subsequently routed within complex network topologies constructed using printed circuit board (PCB), integrated circuits, silicon-based PCB and interposer, or application-specific integrated circuit (ASIC) technology. Using time- and frequency-domain multiplexing, network architectures with up to at least 20,000 edges (for PCB) or 5,000,000 edges (for ASIC) are provided by embodiments of the present invention.

Furthermore, the described NEMS oscillator networks are capable of multiple computational paradigms. Among these include adiabatic classical annealing, reservoir computing, Boltzmann-machine processing, as well as several other types of machine learning and neuromorphic computing. The extremely high dimensionality of the described NEMS networks is beneficial as it enables realization of complex neural networks. The described NEMS networks can be downscaled to reach chip-scale systems, such as in a system on a chip (SOC) configuration. In some embodiments, these networks may provide ultra-low-power analog accelerators that may be integrated within complete systems as SOCs. These and other embodiments of the disclosure, along with many of its advantages and features, are described in more detail in conjunction with the text below and corresponding figures.

DETAILED DESCRIPTION OF SPECIFIC EMBODIMENTS

Embodiments described herein provide for nanoelectromechanical systems (NEMS) oscillator networks and methods for using and training such networks. In some embodiments, analog computers consisting of a multi-node analog networks based on self-sustaining NEMS oscillators are provided. Using these computers and corresponding networks, analog computations of multiple combinatorial optimization problems and other neuromorphic computations may be executed.

With respect to the various described embodiments, NEMS devices may be mechanical resonating elements made of semiconductor, piezoelectric, metal, and other materials. One feature of such devices is the existence of the strong and easily accessible nonlinearity of the elements. This nonlinearity includes properties such as a change in resonant frequency and/or quality factor (damping rate) upon a change in amplitude of vibration. For NEMS devices, easily accessible nonlinearity may mean frequency shifts by 1% to 10% at small amplitudes with low actuation voltages from 1 mV to 10 V.

Several types of nonlinearity exist in NEMS devices. In some instances, there is "Duffing" nonlinearity which states that the frequency shift is proportional to the square of the amplitude of the vibration, in which the frequency can go up or down. In some instances, there is nonlinearity associated with a change in damping rate such that the damping rate increases with amplitude and/or the square of the amplitude. Such increases in damping results in a shift down in frequency. In some instances, the shift in Duffing can be much larger than the shift in damping.

In some embodiments, when a NEMS resonator is provided with an actuation input voltage, the amplitude of vibration of the NEMS resonator changes, where the relationship between the actuation input voltage and the amplitude of vibration is linear or nonlinear. When the relationship between the amplitude of vibration and the actuation input voltage is nonlinear, a change in amplitude of vibration of the NEMS resonator will in turn cause a change in the resonant frequency, dissipation, and/or phase-amplitude relationship of the NEMS resonator. By virtue of these relationships, each NEMS resonator is characterized by a nonlinear relationship between the actuation input voltage that is provided to the NEMS resonator and the resonant frequency of the NEMS resonator. In some embodiments, the effects of nonlinearity, such as the change in resonant frequency, further has an effect (e.g., change in frequency and/or amplitude) on the radio frequency (RF) output signal generated by the corresponding NEMS oscillator that includes the NEMS resonator. In the network, where oscillators are coupled, the outputs of oscillator are sent to the inputs of other oscillators. As a result, the effects of nonlinearity allow one oscillator's frequency to be changed by the other oscillator's frequencies.

Embodiments are described in which NEMS networks receive an input of various signals. As a result, the networks oscillate and evolve with complex dynamics. The dynamics may be used for clustering and unsupervised learning in machine learning applications. The dynamics may project the input signals (at the present time and previously received input signals) into high dimensional states of dynamics. Such states can then be grouped and classified into different categories ("clustering") for identification, sorting, decision making and other applications.

In the following description, various examples will be described. For purposes of explanation, specific configurations and details are set forth in order to provide a thorough understanding of the examples. However, it will also be apparent to one skilled in the art that the example may be practiced without the specific details. Furthermore, well-known features may be omitted or simplified in order not to obscure the embodiments being described.

Figure 1:
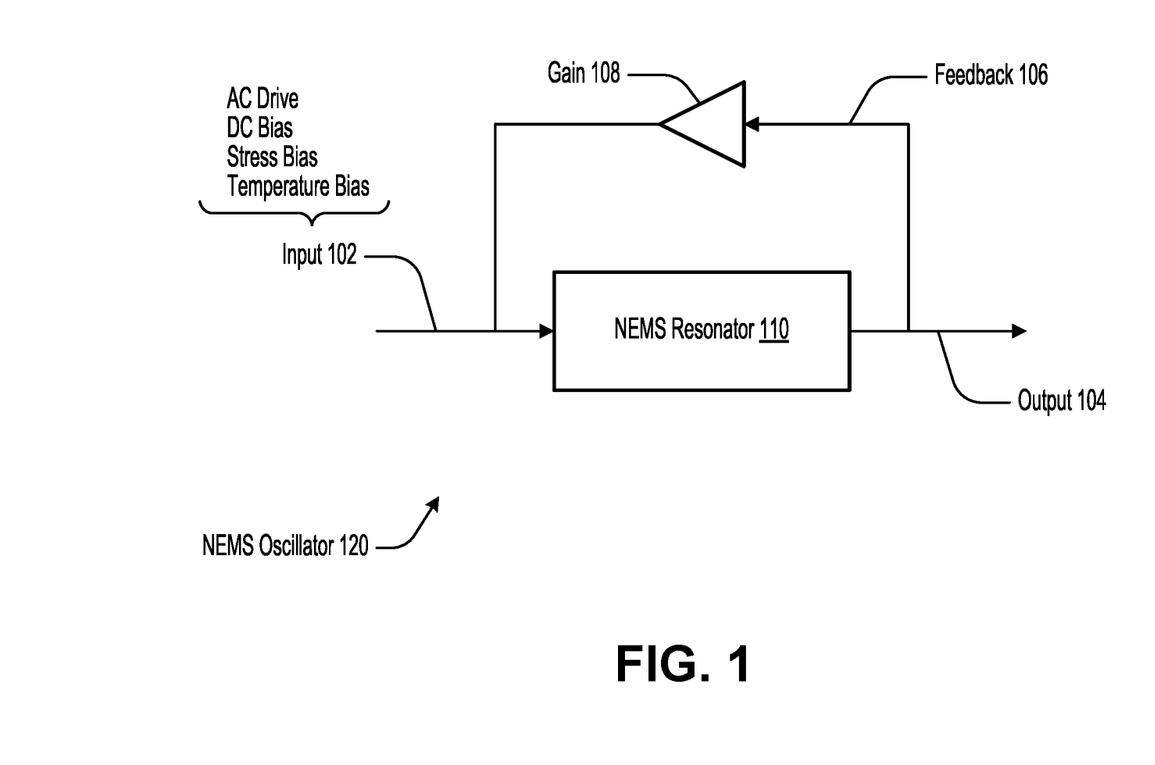
FIG. 1 illustrates an example NEMS oscillator according to an embodiment of the present invention.

FIG. 1 illustrates an example NEMS oscillator 120, in accordance with some embodiments of the present disclosure. NEMS oscillator 120 includes an input 102, an output 104, a NEMS resonator 110, and a gain element 108 positioned along a feedback path 106 extending between output 104 and input 102. Input 102 may include an alternative current (AC) drive, a direct current (DC) bias, a stress bias, and a temperature bias, among other possibilities. Output 104 may include one or more of these components. As described herein, a RF output signal may be generated at output 104. The RF output signal may oscillate at a particular frequency and a particular phase.

In some embodiments, NEMS oscillator 120 may be a nonlinear oscillator when powered by feedback path 106 for oscillation at radio frequencies (20 kHz to 300 GHz). This may be at least partially enabled by feedback path 106 including linear and parametric feedback components. In some examples, NEMS oscillator 120 is driven into nonlinearity at very low voltage (1 to 10 mV) and very low power (<nW each). This enables low power, large scale operation of a NEMS oscillator network.

In some embodiments, NEMS resonator 110 can be directly driven by an AC drive. When implemented in a network, NEMS oscillator 120 may produce and send out an output RF signal at output 104 into the network. NEMS oscillator 120 can also receive signals from other components in the network (e.g., other NEMS oscillators) at input 102. The frequency of NEMS oscillator 120 can be precisely tuned (resolution better than 1 ppm) through the DC bias, mechanical stress, temperature control, etc. While NEMS resonator 110 may act as a transceiver for electrical RF signals, in some embodiments it may use a different method of actuation and detection including piezoelectricity, thermal actuation, piezoresistive detection, etc.

NEMS oscillator 120 can interact with other NEMS oscillators through the RF output signal it produces. For example, the actual instantaneous frequency and phase of the oscillation of the RF output signal may vary depending on the state of oscillation itself and the inputs into to the network. In some embodiments, a rule of interaction may be that two oscillators are to be within the "line-width". For example, for a resonator of 10 MHz and quality factor Q=1000, the linewidth may be 10 MHz/1000=10 kHz. A further description of NEMS oscillators and their operation can be found in U.S. Pat. No. 9,660,654, entitled "SYNCHRONIZATION OF NANOMECHANICAL OSCILLATORS", the disclosure of which is hereby incorporated by reference in its entirety.

Figure 2:
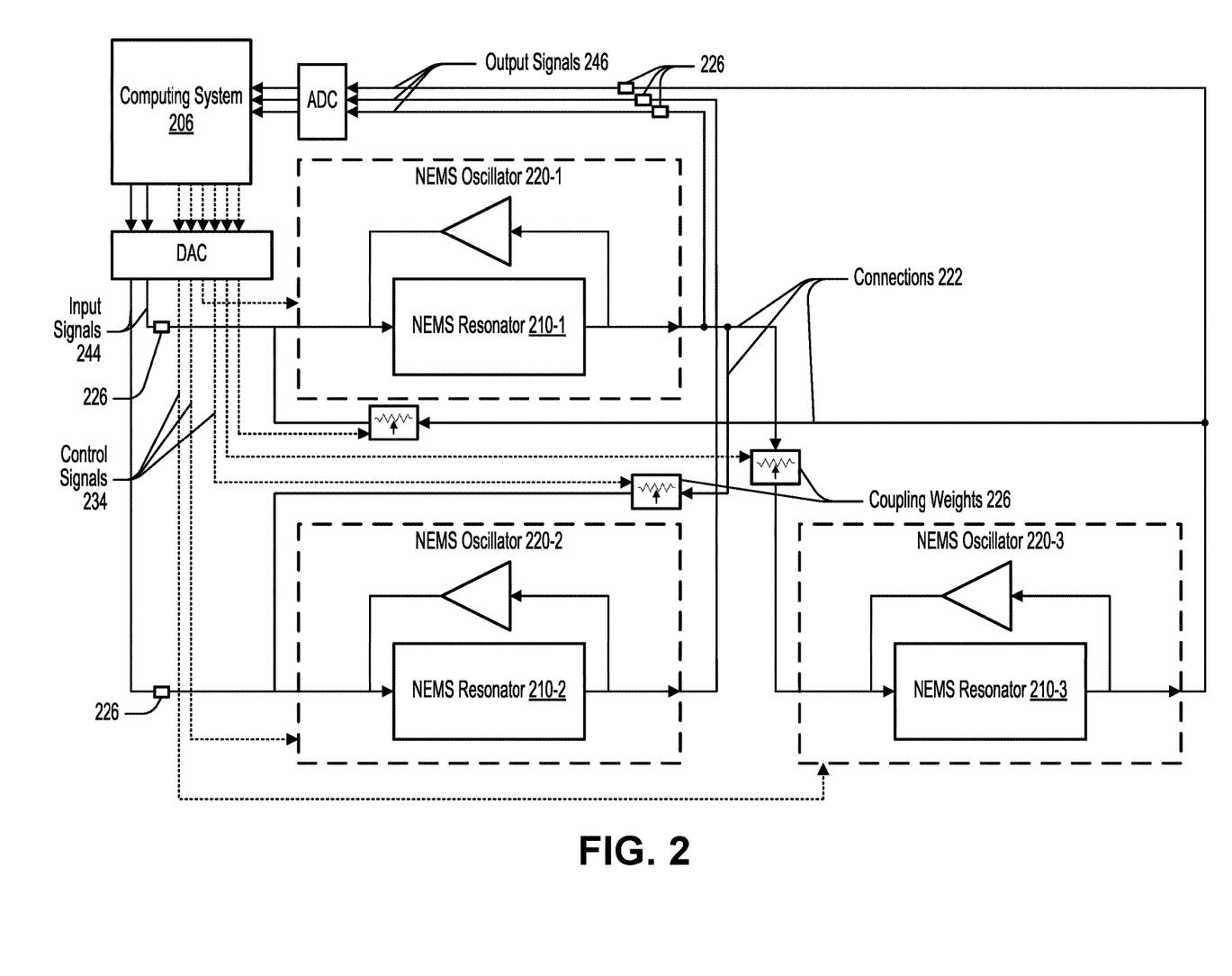
FIG. 2 illustrates an example configuration of multiple NEMS oscillators according to an embodiment of the present invention.

FIG. 2 illustrates an example configuration of multiple NEMS oscillators 220, in accordance with some embodiments of the present disclosure. The illustrated configuration may correspond to a NEMS oscillator network that is integrated with a control and readout system, which may be implemented by a computing system 206 and one or more digital-to-analog converters (DACs) and analog-to-digital converters (ADCs). Computing system 206 may generate input signals 244, which may correspond to the input signals of the NEMS oscillator network. Computing system 206 may also read output signals 246, which may correspond to the output signals of the NEMS oscillator network.

NEMS oscillators 220 are interconnected via connections 222. For example, the output of NEMS oscillator 220-1 is connected to the input of NEMS oscillator 220-2 and the input of NEMS oscillator 220-3, and the output of NEMS oscillator 220-3 is connected to the input of NEMS oscillator 220-1. Note that NEMS oscillators 220-2 and 220-3 are not directly connected. In the illustrated example, each of the connections 222 includes a coupling weight 226 that affects the RF signal that is passed therethrough. For example, each coupling weight 226 may cause a change in amplitude to the RF signal, a change in phase to the RF signal, among other possibilities. In some embodiments, each coupling weight 226 that is included on a connection 222 between two NEMS oscillators 220 (e.g., between an output of a first NEMS oscillator and an input of a second NEMS oscillator) may cause only a small portion of the RF output signal to be passed therethrough, e.g., 1% or 2% of the amplitude of the RF signal.

Computing system 206 may generate control signals 234 that are fed into the NEMS oscillator network for modifying the functionality of NEMS oscillators 220 and connections 222 (via coupling weights 226). For example, control signals 234 may be provided to the inputs of NEMS oscillators 220, to the inputs of NEMS resonators 210, to the gains of NEMS oscillators 220, to coupling weights 226, among other possibilities. Control signals 234 that are provided to coupling weights 226 may modify and/or set the change in amplitude and the change in phase associated with coupling weights 226.

One aspect of the NEMS oscillator network is that it is fully and rapidly configurable. In some embodiments, this means that connectivity is updated in real time. Another aspect is that connections 222 within the NEMS oscillator network are fully analog. Fully analog networks allow simultaneous parallel operations and low power operations. In some embodiments, control signals 234 may be analog or digital while connections 222 carry analog signals. In some embodiments, control signals 234 can modify coupling weights 226 so as to turn a connection on or off. In some embodiments, control signals 234 may modify a number of configurable parameters including: on/off of connections, the amplitude of connections, the phase of connections, the natural frequency of each NEMS oscillator, etc.

In some implementations, the network is constructed with passive and active radio frequency elements, such as resistors, transistors, inductors, and the like. The networks may be characterized with properties of conventional radio frequency networks, such as transmission, reflection, isolation and cross talk between two paths (corresponding to two different edges and connection in the networks). Methods of electrical isolation, such as termination, buffer amplifiers, etc., are accordingly applied.

Figure 3:
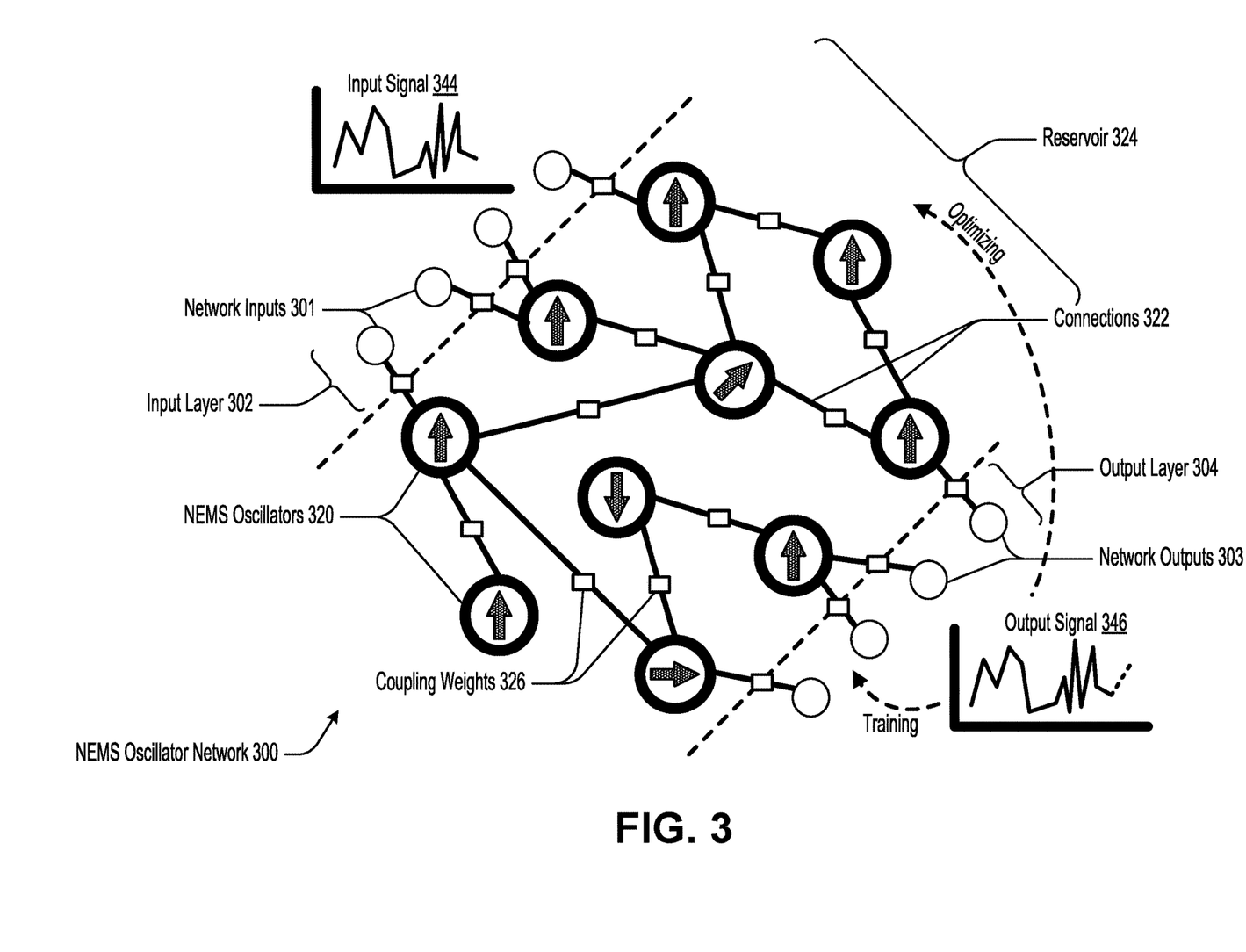
FIG. 3 illustrates an example NEMS oscillator network according to an embodiment of the present invention.

FIG. 3 illustrates an example NEMS oscillator network 300, in accordance with some embodiments of the present disclosure. NEMS oscillator network 300 may include one or more network inputs 301 forming an input layer 302, a number of NEMS oscillators 320 interconnected by connections 322 forming a reservoir 324, and one or more network outputs 303 forming an output layer 304. In the illustrated example, network inputs 301 are connected to a first subset of NEMS oscillators 320 through connections 322 and a second subset of NEMS oscillators 320 are connected to network outputs 303 through connections 322. Each of connections 322 may include a coupling weight 326 that modifies the RF signal passing therethrough. For example, each of coupling weights 326 may allow some percentage of the output RF signal produced by one NEMS oscillator 320 to be sent to the input of another NEMS oscillator.

Each of connections 322 may be unidirectional or bidirectional. A unidirectional connection between two NEMS oscillators may include a connection between the output of one of the NEMS oscillators and the input of the other NEMS oscillator. A bidirectional connection between two NEMS oscillators may include a first connection between the output of the first NEMS oscillator and the input of the second NEMS oscillator and a second connection between the output of the second NEMS oscillator and the input of the first NEMS oscillator. While a single coupling weight 326 is illustrated in FIG. 3 for each connection 322, bidirectional connections may include two different coupling weights for each direction. In general, connections 322 between network inputs 301 and the first subset of NEMS oscillators 320 may be unidirectional connections as well as connections 322 between the second subset of NEMS oscillators 320 and network outputs 303.

For illustrative purposes, the arrow for each of NEMS oscillators 320 may indicate the phase of the RF output signal generated by the corresponding NEMS oscillator, and a rotation of the arrow (not illustrated) may indicate the frequency of the RF output signal generated by the corresponding NEMS oscillator. For example, two NEMS oscillators that are 180 degrees out of phase can be represented by an up arrow and a down arrow. As another example, two NEMS oscillators that have a frequency difference can be depicted by one static arrow representing oscillation at a nominal frequency (e.g., 2 MHz) and another arrow that is slowly rotating clockwise or counterclockwise representing oscillation at a frequency slightly above (e.g., 2.001 MHz) or slightly below (e.g., 1.999 MHz) the nominal frequency. The frequency and phase of oscillation is a representation of the state of the oscillator. The state of the oscillator follows both its own dynamics as well as input from other oscillators through the network. Generally, for two oscillators to interact, their frequencies are close such that they are within the linewidth. In other scenarios, nonlinear mixing involving 2, 3 or 4 frequencies are possible when the product of mixing is also within the interaction range.

During runtime or during training of NEMS oscillator network 300, one or more input signals 344 may be provided at one or more network inputs 301 of input layer 302. For example, a first input signal 344 may be provided at a first network input 301 and a second input signal 344 may be provided at a second network input 301. Each of input signals 344 may include a plurality of time-sequenced values, which may, in some embodiments, be converted into RF signals prior to providing input signals 344 at network inputs 301.

Prior to, during, or subsequent to providing input signals 344 at network inputs 301, each of NEMS oscillators 320 may be caused to produce an RF output signal that oscillates at a particular frequency and a particular phase. This RF output signal may be referred to as an initial RF output signal. When the first time-sequenced values of input signals 344 are provided at network inputs 301, the input signals are propagated through connections 322 to the first subset of NEMS oscillators 320 that are coupled to network inputs 301. The RF output produced by each of the first subset of NEMS oscillators 320 is then adjusted to a new RF output signal that oscillates at a particular frequency (which may be different than the initial frequency) and a particular phase (which may be different than the initial phase). This RF output signal may be referred to as an adjusted RF output signal.

The adjusted RF output signals produced by the first subset of NEMS oscillators 320 are propagated through the remaining NEMS oscillators 320, causing each of NEMS oscillators 320 to produce an adjusted RF output signal. The adjusted RF output signals produced by the second subset of NEMS oscillators 320 (those coupled to network outputs 303) are fed to network outputs 303 and output by NEMS oscillator network 300. These adjusted RF output signals may correspond to output signals 346, which are read and used for computation by the computing system.

In some embodiments, NEMS oscillator network 300 can be used for time series prediction. In one example, input signals 344 provided at each of network inputs 301 may correspond to stock prices of different companies, such as companies A, B, and C. The stock prices $P_A(T)$, $P_B(T)$, and $P_C(T)$ of companies A, B, and C, respectively, can be input into input layer 302 by modulating the amplitude of the AC drive, e.g., $V(t)=P_A(t/T) \times \sin(\omega t)$ where V(t) is the voltage at one of network inputs 301. Since the resonators have quick response times, the stock prices for a whole year can be compressed into a very short pulse (e.g., 0.01 ms). The prices of the different stocks are input into different nodes (e.g., network inputs 301) of input layer 302.

Continuing with the above example, the stock prices from day 1 to day 100 may be available and it may be desired to predict the stock price on day 101. The stock prices from day 1 to day 10 may be input at input layer 302 (for company A only or for all companies). The output V(10) is read at one of network outputs 303 and is compared to the actual price on day $11=P_A(11)$. The mapping between V(10) and $P_A(11)$ may be developed according to reservoir computing by linear mapping, thus reconciling the predicting process and reality. This may correspond to a training step for training NEMS oscillator network 300. This process may be repeated, for example, using data from day 2 to day 11 to predict day 12, using data from day 3 to day 12 to predict day 13, and so on until day 100.

Once NEMS oscillator network 300 is trained, it may be used in a runtime scenario. Continuing with the above example, the stock price data from day 91 to 100 may input at input layer 302. The output V(100) is then processed by the linear mapping to predict $P_A(101, predicted)$. In some embodiments, the mapping may utilize two or more output signals 346 to predict $P_A(101, predicted)$. For example, a 2D mapping may be utilized to map $V_1(100)$ and $V_2(100)$ to predict $P_A(101, predicted)$. Embodiments in which multiple input signals 344 and multiple output signals 346 are utilized for training and prediction are contemplated and are within the scope of the present disclosure. Such prediction and forecasting networks can be applied to weather forecasting, sales forecasting, process model prediction, and optimization. Health monitoring and event prediction includes the prediction of cardiac arrest based on continuous observation and analysis of signals from the body, such as electroencephalogram (EEG) and blood pressure. Prediction can be further utilized in scientific and engineering processes such as pattern formation, neural biology, and chaotic systems.

In some embodiments, NEMS oscillator network 300 supports propagation and interactions of phase solitons. Phase solitons refer to small, short term changes in the frequency of an oscillator. Such changes can move in the networks from oscillator to oscillator in a non-dissipative manner (the changes do not get smaller and do not change shape spatially). When two solitons collide/encounter, they interact and can change in amplitude and shape. Such interactions can be used for computation. A NEMS soliton system supports all essential function computation, including cascadability (in which the output from one section becomes the input of another section), fan out (connect to multiple outputs), and performance of gate operations such as a NOT gate and other two input gates.

Figure 4:
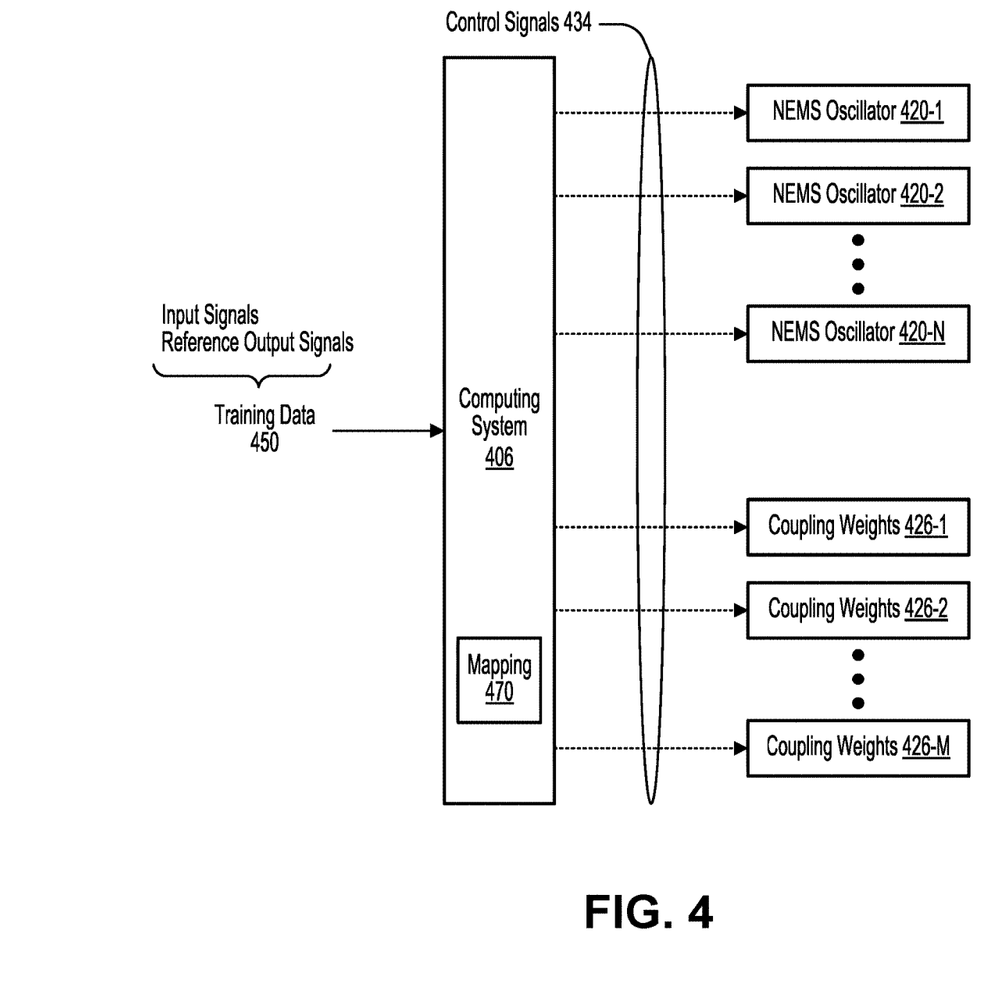
FIG. 4 illustrates a training scheme for a NEMS oscillator network according to an embodiment of the present invention.

FIG. 4 illustrates a training scheme for a NEMS oscillator network, in accordance with some embodiments of the present disclosure. Training data 450 may be provided to a computing system 406. Training data 450 may include one or more input signals and one or more reference output signals. The reference output signals may be a known output or a desired output that correspond to the input signals. In one example, the input signals may be the stock prices of three companies from day 1 to day 10, and the output signals may be the stock prices of the three companies (or of one of the three companies) on day 11.

Upon providing training data 450 to computing system 406, the NEMS oscillator network may operate using the input signals. The output signals that are read by computing system 406 may be compared to the reference output signals to generate error data, representing the difference between the output signals and the reference output signals. Computing system 406 may then modify the NEMS oscillator network based on the error data. For example, computing system 406 may generate control signals 434 that modify one or more of NEMS oscillators 420 or one or more of coupling weights 426. Computing system 406 may alternatively or additionally modify a mapping 470 between output signals and some value of interest (e.g., stock prices). In some embodiments, the NEMS oscillator network may be modified in such a way that the prediction error is decreased (as represented by the error data) during a subsequent prediction using the same input data. In this manner, the NEMS oscillator network may be trained to accurately generate output data for a wide range of input data.

Figure 5:
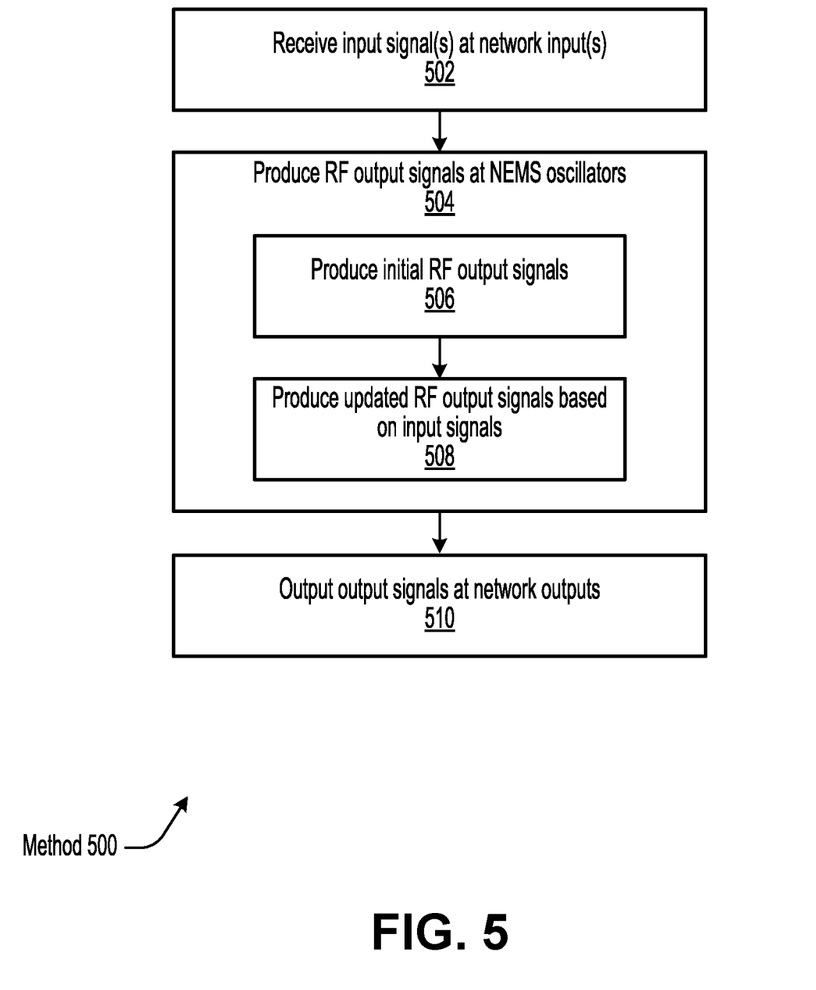
FIG. 5 illustrates an example method of operating a NEMS oscillator network according to an embodiment of the present invention.

FIG. 5 illustrates an example method 500 of operating a NEMS oscillator network (e.g., NEMS oscillator network 300), in accordance with some embodiments of the present disclosure. One or more steps of method 500 may be omitted during performance of method 500, and steps of method 500 need not be performed in the order shown. One or more steps of method 500 may be performed by one or more processors, such as those included in a computing system (e.g., computing systems 206, 406). Method 500 may be implemented as a computer-readable medium or computer program product comprising instructions which, when the program is executed by one or more computers, cause the one or more computers to carry out the steps of method 500. Such computer program products can be transmitted, over a wired or wireless network, in a data carrier signal carrying the computer program product.

At step 502, one or more input signals (e.g., input signals 244, 344) are received at one or more network inputs (e.g., network inputs 301) of the NEMS oscillator network. The one or more network inputs may form an input layer (e.g., input layer 302). The NEMS oscillator network may include a plurality of NEMS oscillators (e.g., NEMS oscillators 120, 220, 320, 420). In some embodiments, each NEMS oscillator of the plurality of NEMS oscillators includes a NEMS resonator (e.g., NEMS resonators 110, 210). In some embodiments, each NEMS oscillator of the plurality of NEMS oscillators includes a feedback path (e.g., feedback 106) between an output (e.g., output 104) of the NEMS resonator and an input (e.g., input 102) of the NEMS resonator. In some embodiments, a nonlinear relationship exists between an actuation input voltage provided to the NEMS resonator and an amplitude of the RF output signal, a phase of the RF output signal, and/or a resonant frequency of the NEMS resonator.

At step 504, an RF output signal is produced at each NEMS oscillator of the plurality of NEMS oscillators. The RF output signal may oscillate at a particular frequency and a particular phase. The plurality of NEMS oscillators may be coupled to the one or more network inputs. The NEMS oscillator network may include a plurality of connections (e.g., connections 222, 322) that interconnect the plurality of NEMS oscillators. In some examples, each NEMS oscillator of the plurality of NEMS oscillators is connected to at least one other NEMS oscillator of the plurality of NEMS oscillators through at least one connection of the plurality of connections.

In some embodiments, each connection of the plurality of connections includes a coupling weight (e.g., coupling weights 226, 326, 426). In some embodiments, the coupling weight may cause a change in amplitude to RF output signals (or input signals) passing through the connection that includes the coupling weight. In some embodiments, the coupling weight may cause a change in phase to RF output signals (or input signals) passing through the connection that includes the coupling weight. In some embodiments, the RF output signal produced at each NEMS oscillator of the plurality of NEMS oscillators is sent through at least one connection of the plurality of connections.

In some embodiments, step 504 may include one or both of steps 506 and 508. At step 506, an initial RF output signal is produced at each NEMS oscillator of the plurality of NEMS oscillators. At step 508, an updated RF output signal is produced at each NEMS oscillator of the plurality of NEMS oscillators. The updated RF output signal may be produced in response to the one or more input signals being provided at the one or more network inputs.

At step 510, one or more output signals (e.g., output signals 246, 346) are output at one or more network outputs (e.g., network outputs 303) of the NEMS oscillator network. The one or more network outputs may be coupled to the plurality of NEMS oscillators. The one or more network outputs may form an output layer (e.g., output layer 304). The one or more output signals may be read by the computing system. The one or more output signals may be converted into a value of interest using a mapping (e.g., mapping 470).

Figure 6:
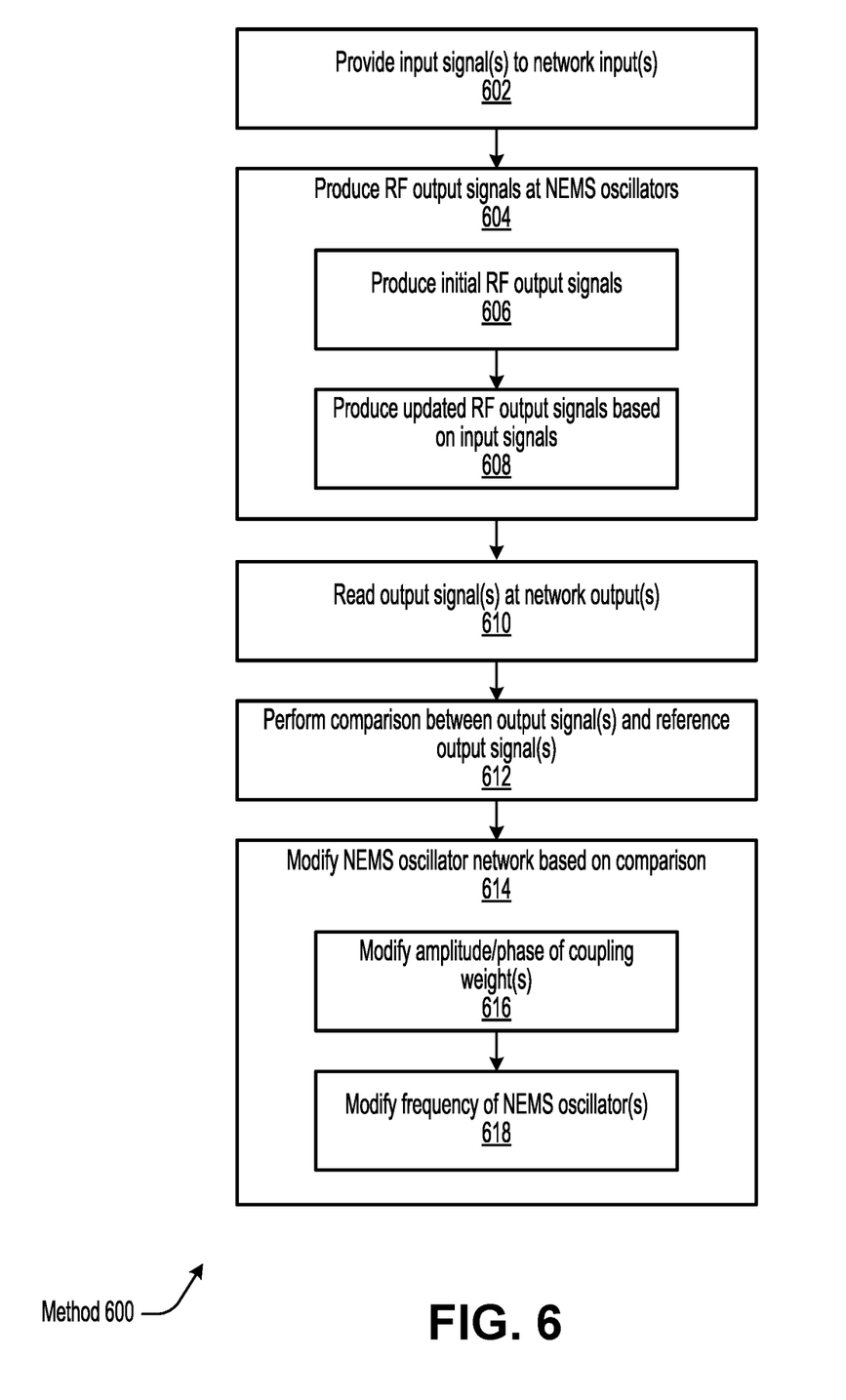
FIG. 6 illustrates another example method of training a NEMS oscillator network according to an embodiment of the present invention.

FIG. 6 illustrates an example method 600 of training a NEMS oscillator network (e.g., NEMS oscillator network 300), in accordance with some embodiments of the present disclosure. One or more steps of method 600 may be omitted during performance of method 600, and steps of method 600 need not be performed in the order shown. One or more steps of method 600 may be performed by one or more processors, such as those included in a computing system (e.g., computing systems 206, 406). Method 600 may be implemented as a computer-readable medium or computer program product comprising instructions which, when the program is executed by one or more computers, cause the one or more computers to carry out the steps of method 600. Such computer program products can be transmitted, over a wired or wireless network, in a data carrier signal carrying the computer program product.

At step 602, one or more input signals (e.g., input signals 244, 344) are provided at one or more network inputs (e.g., network inputs 301) of the NEMS oscillator network. The one or more network inputs may form an input layer (e.g., input layer 302). The NEMS oscillator network may include a plurality of NEMS oscillators (e.g., NEMS oscillators 120, 220, 320, 420). In some embodiments, each NEMS oscillator of the plurality of NEMS oscillators includes a NEMS resonator (e.g., NEMS resonators 110, 210). In some embodiments, each NEMS oscillator of the plurality of NEMS oscillators includes a feedback path (e.g., feedback 106) between an output (e.g., output 104) of the NEMS resonator and an input (e.g., input 102) of the NEMS resonator.

At step 604, an RF output signal is produced at each NEMS oscillator of the plurality of NEMS oscillators. The RF output signal may oscillate at a particular frequency and a particular phase. The plurality of NEMS oscillators may be coupled to the one or more network inputs. The NEMS oscillator network may include a plurality of connections (e.g., connections 222, 322) that interconnect the plurality of NEMS oscillators. In some examples, each NEMS oscillator of the plurality of NEMS oscillators is connected to at least one other NEMS oscillator of the plurality of NEMS oscillators through at least one connection of the plurality of connections.

In some embodiments, each connection of the plurality of connections includes a coupling weight of a plurality of coupling weights (e.g., coupling weights 226, 326, 426). In some embodiments, the coupling weight may cause a change in amplitude to RF output signals (or input signals) passing through the connection that includes the coupling weight. In some embodiments, the coupling weight may cause a change in phase to RF output signals (or input signals) passing through the connection that includes the coupling weight. In some embodiments, the RF output signal produced at each NEMS oscillator of the plurality of NEMS oscillators is sent through at least one connection of the plurality of connections.

In some embodiments, step 604 may include one or both of steps 606 and 608. At step 606, an initial RF output signal is produced at each NEMS oscillator of the plurality of NEMS oscillators. At step 608, an updated RF output signal is produced at each NEMS oscillator of the plurality of NEMS oscillators. The updated RF output signal may be produced in response to the one or more input signals being provided at the one or more network inputs.

At step 610, one or more output signals (e.g., output signals 246, 346) are read at one or more network outputs (e.g., network outputs 303) of the NEMS oscillator network. The one or more network outputs may be coupled to the plurality of NEMS oscillators. The one or more network outputs may form an output layer (e.g., output layer 304).

At step 612, a comparison between the one or more output signals and one or more reference output signals may be performed. In some embodiments, error data representing the difference between the one or more output signals and the one or more reference output signals may be calculated.

At step 614, the NEMS oscillator network may be modified based on the comparison. In some embodiments, step 614 may include one or both of steps 616 and 618. At step 616, a change in amplitude or a change in phase for at least one of the plurality of coupling weights is modified based on the comparison. At step 618, the particular frequency for at least one NEMS oscillator of the plurality of NEMS oscillators is modified based on the comparison. In some embodiments, modifying the NEMS oscillator network based on the comparison causes an error/difference between the one or more output signals and the one or more reference output signals to decrease. In some embodiments, steps 602 to 618 may be repeated for each of multiple training iterations.

Figure 7:
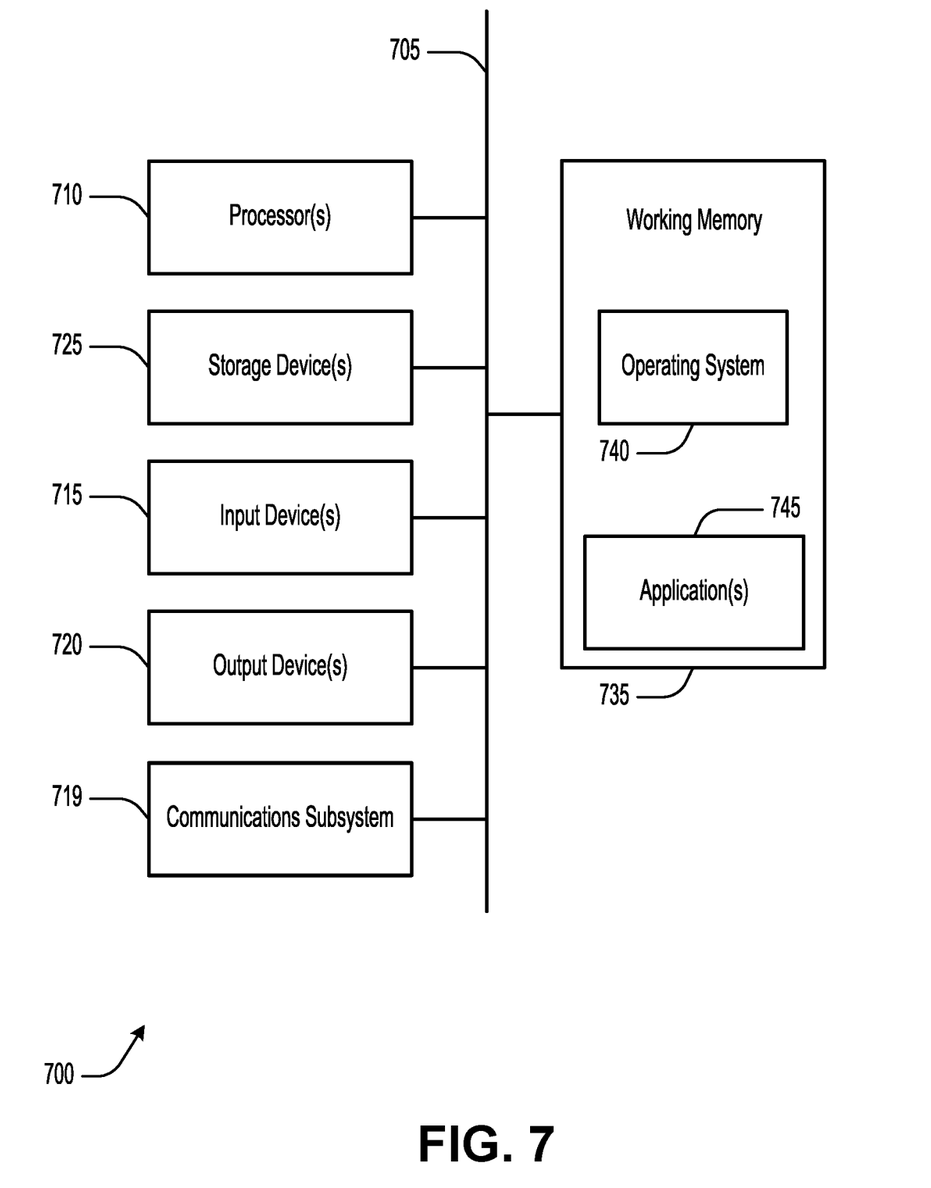
FIG. 7 illustrates a simplified computer system according to an embodiment of the present invention.

FIG. 7 illustrates a simplified computer system 700, in accordance with some embodiments of the present disclosure. Computer system 700 as illustrated in FIG. 7 may be incorporated into devices described herein. FIG. 7 provides a schematic illustration of one embodiment of computer system 700 that can perform some or all of the steps of the methods provided by various embodiments. It should be noted that FIG. 7 is meant only to provide a generalized illustration of various components, any or all of which may be utilized as appropriate. FIG. 7, therefore, broadly illustrates how individual system elements may be implemented in a relatively separated or relatively more integrated manner.

Computer system 700 is shown comprising hardware elements that can be electrically coupled via a bus 705, or may otherwise be in communication, as appropriate. The hardware elements may include one or more processors 710, including without limitation one or more general-purpose processors and/or one or more special-purpose processors such as digital signal processing chips, graphics acceleration processors, and/or the like; one or more input devices 715, which can include without limitation a mouse, a keyboard, a camera, and/or the like; and one or more output devices 720, which can include without limitation a display device, a printer, and/or the like.

Computer system 700 may further include and/or be in communication with one or more non-transitory storage devices 725, which can comprise, without limitation, local and/or network accessible storage, and/or can include, without limitation, a disk drive, a drive array, an optical storage device, a solid-state storage device, such as a random access memory ("RAM"), and/or a read-only memory ("ROM"), which can be programmable, flash-updateable, and/or the like. Such storage devices may be configured to implement any appropriate data stores, including without limitation, various file systems, database structures, and/or the like.

Computer system 700 might also include a communications subsystem 719, which can include without limitation a modem, a network card (wireless or wired), an infrared communication device, a wireless communication device, and/or a chipset such as a Bluetooth™ device, an 802.11 device, a WiFi device, a WiMax device, cellular communication facilities, etc., and/or the like. The communications subsystem 719 may include one or more input and/or output communication interfaces to permit data to be exchanged with a network such as the network described below to name one example, other computer systems, television, and/or any other devices described herein. Depending on the desired functionality and/or other implementation concerns, a portable electronic device or similar device may communicate image and/or other information via the communications subsystem 719. In other embodiments, a portable electronic device, e.g. the first electronic device, may be incorporated into computer system 700, e.g., an electronic device as an input device 715. In some embodiments, computer system 700 will further comprise a working memory 735, which can include a RAM or ROM device, as described above.

Computer system 700 also can include software elements, shown as being currently located within the working memory 735, including an operating system 740, device drivers, executable libraries, and/or other code, such as one or more application programs 745, which may comprise computer programs provided by various embodiments, and/ or may be designed to implement methods, and/or configure systems, provided by other embodiments, as described herein. Merely by way of example, one or more procedures described with respect to the methods discussed above, might be implemented as code and/or instructions executable by a computer and/or a processor within a computer; in an aspect, then, such code and/or instructions can be used to configure and/or adapt a general purpose computer or other device to perform one or more operations in accordance with the described methods.

A set of these instructions and/or code may be stored on a non-transitory computer-readable storage medium, such as the storage device(s) 725 described above. In some cases, the storage medium might be incorporated within a computer system, such as computer system 700. In other embodiments, the storage medium might be separate from a computer system e.g., a removable medium, such as a compact disc, and/or provided in an installation package, such that the storage medium can be used to program, configure, and/or adapt a general purpose computer with the instructions/code stored thereon. These instructions might take the form of executable code, which is executable by computer system 700 and/or might take the form of source and/or installable code, which, upon compilation and/or installation on computer system 700 e.g., using any of a variety of generally available compilers, installation programs, compression/decompression utilities, etc., then takes the form of executable code.

It will be apparent to those skilled in the art that substantial variations may be made in accordance with specific requirements. For example, customized hardware might also be used, and/or particular elements might be implemented in hardware, software including portable software, such as applets, etc., or both. Further, connection to other computing devices such as network input/output devices may be employed.

As mentioned above, in one aspect, some embodiments may employ a computer system such as computer system 700 to perform methods in accordance with various embodiments of the technology. According to a set of embodiments, some or all of the procedures of such methods are performed by computer system 700 in response to processor 710 executing one or more sequences of one or more instructions, which might be incorporated into the operating system 740 and/or other code, such as an application program 745, contained in the working memory 735. Such instructions may be read into the working memory 735 from another computer-readable medium, such as one or more of the storage device(s) 725. Merely by way of example, execution of the sequences of instructions contained in the working memory 735 might cause the processor(s) 710 to perform one or more procedures of the methods described herein. Additionally or alternatively, portions of the methods described herein may be executed through specialized hardware.

The terms "machine-readable medium" and "computer-readable medium," as used herein, refer to any medium that participates in providing data that causes a machine to operate in a specific fashion. In an embodiment implemented using computer system 700, various computer-readable media might be involved in providing instructions/ code to processor(s) 710 for execution and/or might be used to store and/or carry such instructions/code. In many implementations, a computer-readable medium is a physical and/ or tangible storage medium. Such a medium may take the form of a non-volatile media or volatile media. Non-volatile media include, for example, optical and/or magnetic disks, such as the storage device(s) 725. Volatile media include, without limitation, dynamic memory, such as the working memory 735.

Common forms of physical and/or tangible computer-readable media include, for example, a floppy disk, a flexible disk, hard disk, magnetic tape, or any other magnetic medium, a CD-ROM, any other optical medium, punch-cards, papertape, any other physical medium with patterns of holes, a RAM, a PROM, EPROM, a FLASH-EPROM, any other memory chip or cartridge, or any other medium from which a computer can read instructions and/or code.

Various forms of computer-readable media may be involved in carrying one or more sequences of one or more instructions to the processor(s) 710 for execution. Merely by way of example, the instructions may initially be carried on a magnetic disk and/or optical disc of a remote computer. A remote computer might load the instructions into its dynamic memory and send the instructions as signals over a transmission medium to be received and/or executed by computer system 700.

The communications subsystem 719 and/or components thereof generally will receive signals, and the bus 705 then might carry the signals and/or the data, instructions, etc. carried by the signals to the working memory 735, from which the processor(s) 710 retrieves and executes the instructions. The instructions received by the working memory 735 may optionally be stored on a non-transitory storage device 725 either before or after execution by the processor(s) 710.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of exemplary configurations including implementations. However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a schematic flowchart or block diagram. Although each may describe the operations as a sequential process, many of the operations can be performed in parallel or concurrently. In addition, the order of the operations may be rearranged. A process may have additional steps not included in the figure. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

Having described several example configurations, various modifications, alternative constructions, and equivalents may be used without departing from the spirit of the disclosure. For example, the above elements may be components of a larger system, wherein other rules may take precedence over or otherwise modify the application of the technology. Also, a number of steps may be undertaken before, during, or after the above elements are considered. Accordingly, the above description does not bind the scope of the claims.

As used herein and in the appended claims, the singular forms "a", "an", and "the" include plural references unless the context clearly dictates otherwise. Thus, for example, reference to "a user" includes a plurality of such users, and reference to "the processor" includes reference to one or more processors and equivalents thereof known to those skilled in the art, and so forth.

Also, the words "comprise", "comprising", "contains", "containing", "include", "including", and "includes", when used in this specification and in the following claims, are intended to specify the presence of stated features, integers, components, or steps, but they do not preclude the presence or addition of one or more other features, integers, components, steps, acts, or groups.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of training a nanoelectromechanical systems (NEMS) oscillator network, the method comprising:
   providing one or more input signals from a training dataset to one or more network inputs of the NEMS oscillator network;
   producing, for each NEMS oscillator of a plurality of NEMS oscillators of the NEMS oscillator network, a radio frequency (RF) output signal that oscillates at a particular frequency and a particular phase, wherein the plurality of NEMS oscillators are coupled to the one or more network inputs, and wherein the NEMS oscillator network includes a plurality of connections that interconnect the plurality of NEMS oscillators such that each NEMS oscillator of the plurality of NEMS oscillators is connected to at least one other NEMS oscillator of the plurality of NEMS oscillators through at least one connection of the plurality of connections;
   reading one or more output signals at one or more network outputs of the NEMS oscillator network, the one or more network outputs being coupled to the plurality of NEMS oscillators; and
   modifying the NEMS oscillator network based on the one or more output signals.

2. The method of claim 1, further comprising:
   performing a comparison between the one or more output signals and one or more reference output signals from the training dataset, wherein modifying the NEMS oscillator network based on the one or more output signals includes modifying the NEMS oscillator network based on the comparison.

3. The method of claim 1, wherein each NEMS oscillator of the plurality of NEMS oscillators includes a NEMS resonator, wherein a nonlinear relationship exists between an actuation input voltage provided to the NEMS resonator and an amplitude and phase of the RF output signal.

4. The method of claim 3, wherein each NEMS oscillator of the plurality of NEMS oscillators further includes a feedback path between an output of the NEMS resonator and an input of the NEMS resonator.

5. The method of claim 1, wherein each connection of the plurality of connections includes a coupling weight of a plurality of coupling weights, the coupling weight causing a change in amplitude of RF output signals passing through the connection.

6. The method of claim 5, wherein modifying the NEMS oscillator network includes modifying the change in amplitude for at least one of the plurality of coupling weights.

7. The method of claim 5, wherein each coupling weight of the plurality of coupling weights further causes a change in phase of the RF output signals passing through the connection.

8. The method of claim 1, further comprising:
sending the RF output signal produced at each NEMS oscillator of the plurality of NEMS oscillators through at least one connection of the plurality of connections.

9. A non-transitory computer-readable medium comprising instructions that, when executed by one or more processors, cause the one or more processors to perform operations for training a nanoelectromechanical systems (NEMS) oscillator network, the operations comprising:
providing one or more input signals from a training dataset to one or more network inputs of the NEMS oscillator network;
causing, for each NEMS oscillator of a plurality of NEMS oscillators of the NEMS oscillator network, a radio frequency (RF) output signal to be produced that oscillates at a particular frequency and a particular phase, wherein the plurality of NEMS oscillators are coupled to the one or more network inputs, and wherein the NEMS oscillator network includes a plurality of connections that interconnect the plurality of NEMS oscillators such that each NEMS oscillator of the plurality of NEMS oscillators is connected to at least one other NEMS oscillator of the plurality of NEMS oscillators through at least one connection of the plurality of connections;
reading one or more output signals at one or more network outputs of the NEMS oscillator network, the one or more network outputs being coupled to the plurality of NEMS oscillators; and
modifying the NEMS oscillator network based on the one or more output signals.

10. The non-transitory computer-readable medium of claim 9, further comprising:
performing a comparison between the one or more output signals and one or more reference output signals from the training dataset, wherein modifying the NEMS oscillator network based on the one or more output signals includes modifying the NEMS oscillator network based on the comparison.

11. The non-transitory computer-readable medium of claim 9, wherein each NEMS oscillator of the plurality of NEMS oscillators includes a NEMS resonator, wherein a nonlinear relationship exists between an actuation input voltage provided to the NEMS resonator and an amplitude and phase of the RF output signal.

12. The non-transitory computer-readable medium of claim 11, wherein each NEMS oscillator of the plurality of NEMS oscillators further includes a feedback path between an output of the NEMS resonator and an input of the NEMS resonator.

13. The non-transitory computer-readable medium of claim 9, wherein each connection of the plurality of connections includes a coupling weight of a plurality of coupling weights, the coupling weight causing a change in amplitude of RF output signals passing through the connection.

14. The non-transitory computer-readable medium of claim 13, wherein modifying the NEMS oscillator network includes modifying the change in amplitude for at least one of the plurality of coupling weights.

15. The non-transitory computer-readable medium of claim 13, wherein each coupling weight of the plurality of coupling weights further causes a change in phase of the RF output signals passing through the connection.

16. A method of training a nanoelectromechanical systems (NEMS) oscillator network, the method comprising:
receiving a training dataset; and
for each of a plurality of training iterations:
providing one or more input signals from the training dataset to one or more network inputs of the NEMS oscillator network;
producing, for each NEMS oscillator of a plurality of NEMS oscillators of the NEMS oscillator network, a radio frequency (RF) output signal that oscillates at a particular frequency and a particular phase, wherein the plurality of NEMS oscillators are coupled to the one or more network inputs, and wherein the NEMS oscillator network includes a plurality of connections that interconnect the plurality of NEMS oscillators such that each NEMS oscillator of the plurality of NEMS oscillators is connected to at least one other NEMS oscillator of the plurality of NEMS oscillators through at least one connection of the plurality of connections;
reading one or more output signals at one or more network outputs of the NEMS oscillator network, the one or more network outputs being coupled to the plurality of NEMS oscillators; and
modifying the NEMS oscillator network based on the one or more output signals.

17. The method of claim 16, further comprising:
for each of a plurality of training iterations:
performing a comparison between the one or more output signals and one or more reference output signals from the training dataset, wherein modifying the NEMS oscillator network based on the one or more output signals includes modifying the NEMS oscillator network based on the comparison.

18. The method of claim 16, wherein each NEMS oscillator of the plurality of NEMS oscillators includes a NEMS resonator, wherein a nonlinear relationship exists between an actuation input voltage provided to the NEMS resonator and an amplitude and phase of the RF output signal.

19. The method of claim 16, wherein each connection of the plurality of connections includes a coupling weight of a plurality of coupling weights, the coupling weight causing a change in amplitude of RF output signals passing through the connection.

20. The method of claim 19, wherein modifying the NEMS oscillator network includes modifying the change in amplitude for at least one of the plurality of coupling weights.

* * * * *